United States Patent
Ebisawa

(10) Patent No.: US 8,534,222 B2
(45) Date of Patent: Sep. 17, 2013

(54) DELIVERY UNIT, COATING APPARATUS, AND COATING METHOD

(75) Inventor: Isao Ebisawa, Hamura (JP)

(73) Assignee: Casio Computer Co., Ltd., Tokyo (JP)

( * ) Notice: Subject to any disclaimer, the term of this patent is extended or adjusted under 35 U.S.C. 154(b) by 337 days.

(21) Appl. No.: 12/874,401

(22) Filed: Sep. 2, 2010

(65) Prior Publication Data
US 2011/0059256 A1 Mar. 10, 2011

(30) Foreign Application Priority Data

Sep. 4, 2009 (JP) ................................. 2009-204369
Jul. 21, 2010 (JP) ................................. 2010-164361

(51) Int. Cl.
*B05B 7/00* (2006.01)
*B05B 13/02* (2006.01)
*B05B 3/00* (2006.01)
*B05B 7/06* (2006.01)
*B05B 3/18* (2006.01)
*B05C 5/00* (2006.01)
*B05C 15/00* (2006.01)
*B05C 9/06* (2006.01)

(52) U.S. Cl.
USPC ........... 118/323; 118/300; 118/305; 118/313; 118/315; 239/750; 427/421.1; 427/424

(58) Field of Classification Search
USPC ......... 118/300, 305, 323; 239/101, 750–754; 347/47, 49; 427/421.1, 424
See application file for complete search history.

(56) References Cited

U.S. PATENT DOCUMENTS

| | | | | |
|---|---|---|---|---|
| 4,376,944 A | * | 3/1983 | Reitberger et al. | 347/47 |
| 4,872,417 A | * | 10/1989 | Kuwabara et al. | 239/752 |
| 5,316,219 A | * | 5/1994 | Christyson et al. | 239/752 |
| 2007/0097198 A1 | * | 5/2007 | Iwata | 347/102 |
| 2009/0057944 A1 | * | 3/2009 | Fork et al. | 264/177.1 |

FOREIGN PATENT DOCUMENTS

| | | |
|---|---|---|
| JP | 10-081005 A | 3/1998 |
| JP | 2000-025238 A | 1/2000 |
| JP | 2002-075640 A | 3/2002 |
| JP | 2002-177843 A | 6/2002 |
| JP | 2007-117922 A | 5/2007 |

OTHER PUBLICATIONS

Japanese Office Action dated Aug. 14, 2012 (and English translation thereof) in counterpart Japanese Application No. 2010-164361.
Japanese Office Action dated Oct. 4, 2011 (and English translation thereof) in counterpart Japanese Application No. 2010-164361.

* cited by examiner

*Primary Examiner* — Dah-Wei Yuan
*Assistant Examiner* — Binu Thomas
(74) *Attorney, Agent, or Firm* — Holtz, Holtz, Goodman & Chick, PC

(57) ABSTRACT

It is an object of the present invention to apply a liquid uniformly on a to-be-coated area of an object subjected to liquid coating. A delivery unit which delivers the liquid on the to-be-coated area of the object subjected to liquid coating comprises a main body filled with the liquid and a nozzle plate which is provided at one end side of the main body and which is provided with a delivery path for delivering the liquid. The axial line of the delivery path is inclined relative to a vertical axis toward an opposite side of a travelling direction in which the delivery unit travels relative to the to-be-coated area.

3 Claims, 13 Drawing Sheets

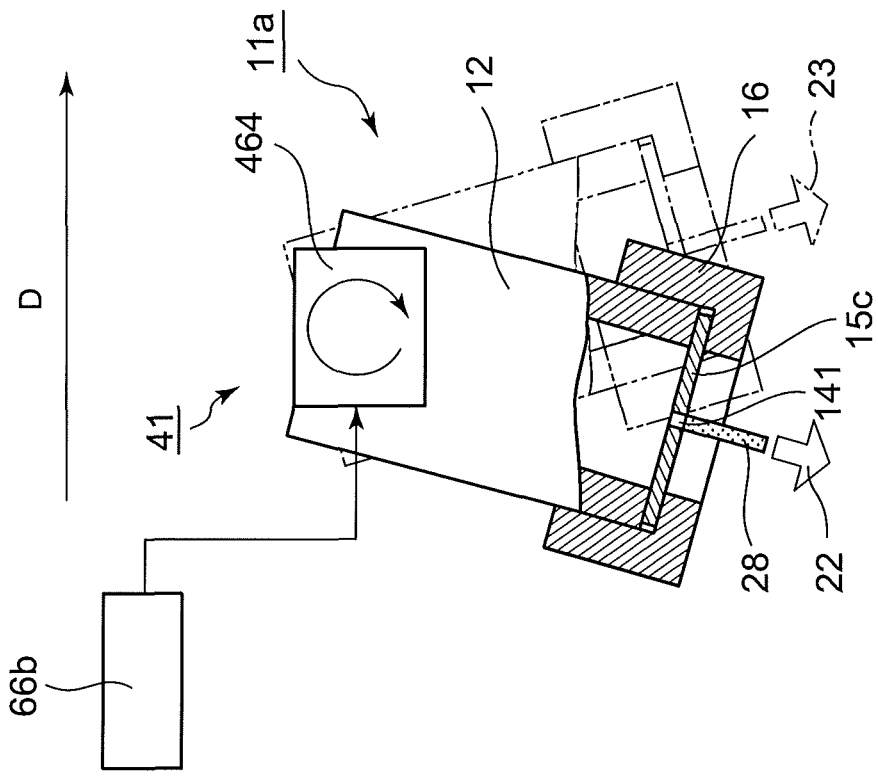
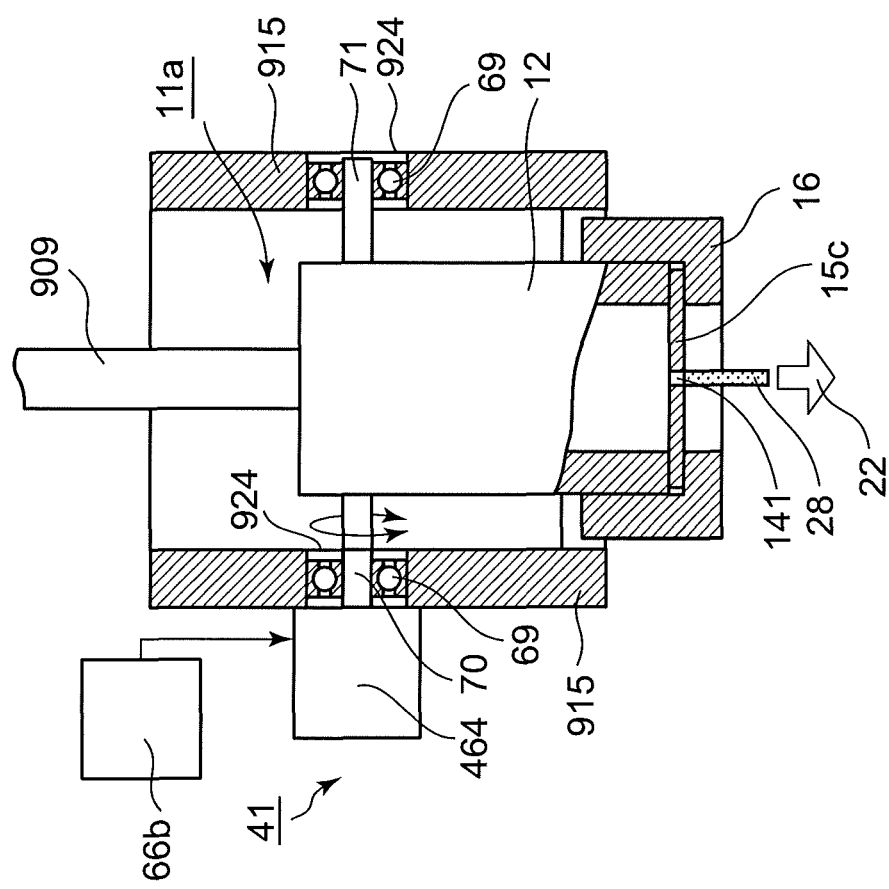

DELIVERY UNIT, COATING APPARATUS, AND COATING METHOD

CROSS-REFERENCE TO RELATED APPLICATION

This application claims the benefit of Japanese Patent Application No. 2009-204369 filed on Sep. 4, 2009, and Japanese Patent Application No. 2010-164361 filed on Jul. 21, 2010, the entire disclosure of which is incorporated by reference herein.

FIELD

This application relates generally to a delivery unit which delivers a fluid, a coating apparatus, and a coating method.

BACKGROUND

Conventionally adopted in a step of forming an organic EL layer including a luminescent layer when an organic EL display device is manufactured is a scheme of moving a nozzle having a nozzle opening for delivering a liquid relative to a substrate, while at the same time, of continuously delivering an organic EL material (the liquid) from the nozzle opening to apply such material, thereby to form an organic EL layer.

For example, Unexamined Japanese Patent Application KOKAI Publication No. 2002-75640 discloses a manufacturing method of an organic EL display device. The method forms a groove corresponding to a predetermined pattern where an organic EL material must be applied on a substrate beforehand, moves the substrate and a nozzle relative to each other so that the nozzle moves along the groove, and allows the organic EL material to flow in the groove from the nozzle to apply such material.

However, the nozzle disclosed in Unexamined Japanese Patent Application KOKAI Publication No. 2002-75640 delivers the liquid while moving in the vertical direction to a surface of an object subjected to liquid coating.

Accordingly, the liquid which is delivered from the nozzle and which lands on the object does not outspread uniformly around the landing point on the object, but outspreads mainly in the travelling direction of the nozzle from the landing point. In particular, when the object is concavo-convex, it is difficult to apply the liquid uniformly.

Therefore, it is particularly difficult to manufacture a large-size organic EL substrate, resulting in restriction of a product specification.

The same is true for a case in which a liquid other than a liquid containing a material of a luminescent layer is applied under a predetermined condition.

The present invention has been made in view of the foregoing circumstance, and the present invention is advantageous for providing a delivery unit which can uniformly apply a liquid on a to-be-coated area of an object subjected to liquid coating, a coating apparatus using the same, and a coating method.

SUMMARY

A delivery unit according to a first aspect of the present invention delivers a liquid to a to-be-coated area of an object subject to liquid coating and comprises: a main body filled with the liquid; and a nozzle plate which is provided at one end side of the main body and which is provided with a delivery path that delivers the liquid, wherein an axial line of the delivery path is inclined relative to a vertical axis toward an opposite side to a travelling direction in which the delivery unit travels relative to the to-be-coated area.

A coating apparatus according to a second aspect of the present invention applies a liquid on a to-be-coated area of an object subjected to liquid coating and comprises: a delivery unit including a main body filled with the liquid, and a nozzle plate which is provided at one end side of the main body and which is provided with a delivery path that delivers the liquid; a moving unit which moves at least either one of the delivery unit or the object subjected to liquid coating so that the delivery unit travels relative to the to-be-coated area of the object subjected to liquid coating; and a delivery-direction changing unit which makes an axial line of the delivery path inclined relative to a vertical axis toward an opposite side to a travelling direction in which the delivery unit travels relative to the to-be-coated area of the object subjected to liquid coating.

According to a third aspect of the present invention, a coating method of applying a liquid on a to-be-coated area of an object subjected to liquid coating comprises steps of: in accordance with a travelling direction in which a delivery unit having a delivery path that delivers the liquid travels relative to the to-be-coated area of the object subjected to liquid coating, making an axial line of the delivery path inclined relative to a vertical axis toward an opposite side to the travelling direction of the delivery unit relative to the to-be-coated area; and allowing the delivery path to deliver the liquid on the to-be-coated area while moving at least either one of the delivery unit or the object subjected to liquid coating so that the delivery unit travels in the travelling direction relative to the to-be-coated area of the object subjected to liquid coating.

According to the present invention, there are provided a delivery unit and a coating apparatus which can apply a solution uniformly and a coating method which can apply a solution uniformly.

BRIEF DESCRIPTION OF THE DRAWINGS

A more complete understanding of this application can be obtained when the following detailed description is considered in conjunction with the following drawings, in which:

FIG. 13A is a side view showing a delivery-direction changing unit of a nozzle according to a second embodiment;

FIG. 13B is a front view showing the delivery-direction changing unit with a delivery direction being changed from a state shown in FIG. 13A;

DETAILED DESCRIPTION

An explanation will be given of a delivery unit, a coating apparatus, and a coating method according to embodiments of the present invention with reference to the accompanying drawings. It should be understood that the present invention is not limited to embodiments (including the disclosure of the drawings) explained below. The embodiments explained below can be changed and modified. In particular, a structural element in the embodiments explained below may be omitted appropriately.

The explanation below will be given of a case in which the present invention is applied to a nozzle-printing type coating apparatus, but the present invention is not limited to this case, and can be applied to an ink-jet type coating apparatus.

In the following explanation, a liquid delivered by the delivery unit is an organic EL material (hereinafter called a solution), but the liquid delivered by the delivery unit can be other liquid. The solution is, for example, a liquid acquired by dissolving or dispersing a high-molecular luminous material in a solvent. The high-molecular luminous material is a conventionally well-known material which can emit light. An example of such a material is a luminous material containing a poly-p-phenylene or polyfluorene conjugated double bond polymer. The solvent is, for example, a water solvent or an organic solvent. An example of the organic solvent is tetralin, tetramethylbenzene, mesitylene, or xylene. As such a solution is applied and the applied solution is dried, an organic EL layer including a luminescent layer, a hole-injecting layer, an interlayer, etc., in an organic EL device is formed.

First Embodiment

Figure 1:
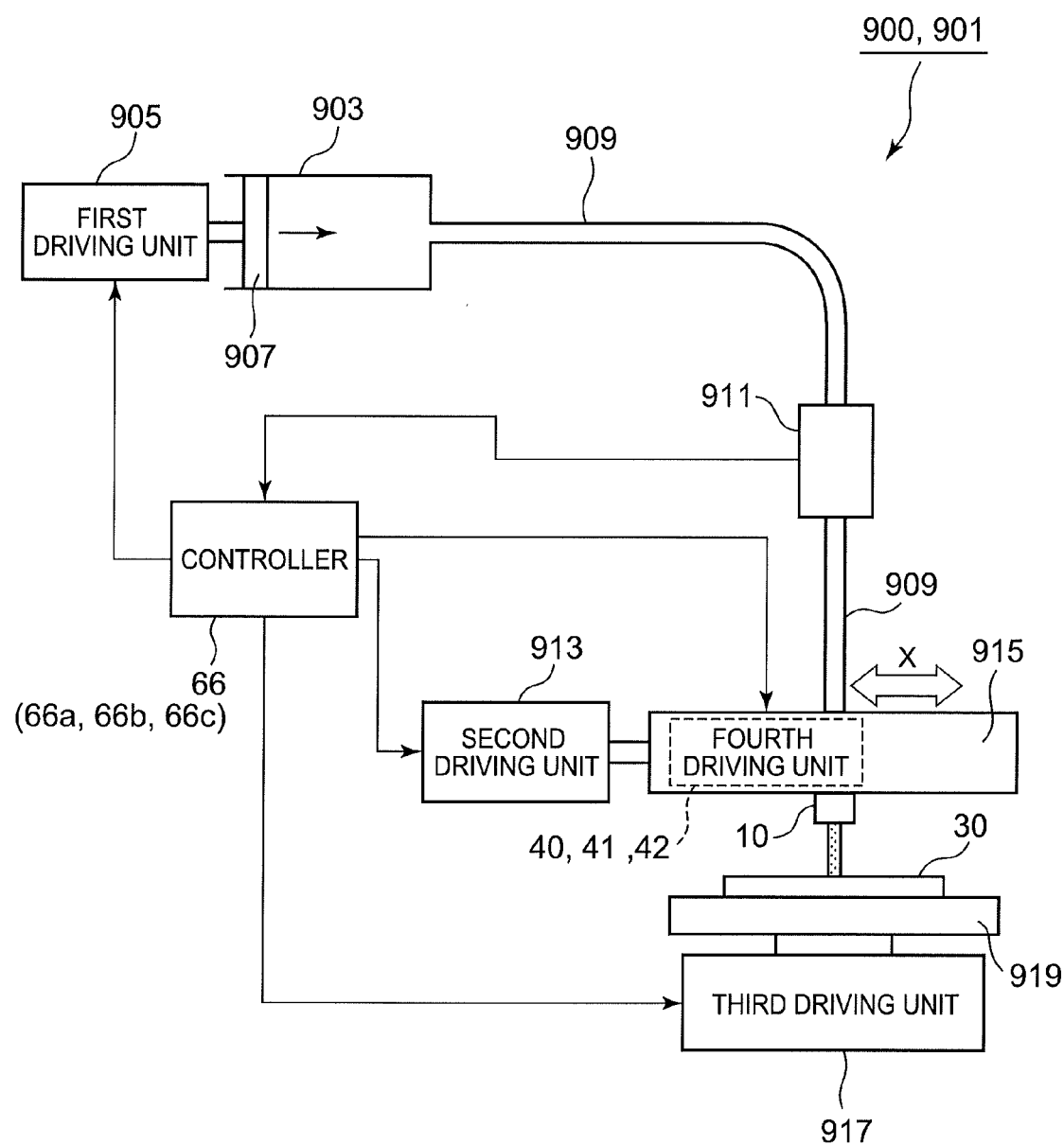
FIG. 1 is an exemplary diagram showing a whole configuration of a coating apparatus.

A coating apparatus 900 applies a solution through a nozzle-printing scheme, and as shown in FIG. 1, mainly comprises a solution tank 903, a supply pipe 909, a pressurizing unit 907, a first driving unit 905, a flow-rate gauge 911, a nozzle (delivery unit) 10, a delivery-unit supporting member 915, a second driving unit 913 (moving unit), a stage 919, a third driving unit 917 (moving unit), a fourth driving unit (a first delivery direction changing unit, hereinafter called a delivery direction changing unit) 40, and a controller 66a. Individual structural elements of the coating apparatus 900 other than the nozzle 10 can be configured by a conventionally well-known unit appropriately. Moreover, a substrate 30 on which a solution is applied from the nozzle 10 is arranged on a stage 919. An explanation will be given of a structure of the substrate 30.

Arranged in a matrix pattern on the substrate 30 are plural pixels configuring an organic EL device having an emission color of R (red), G (green), or B (blue). Plural scan lines are arranged in a row direction, and plural signal lines are arranged in a column direction so as to be orthogonal to respective scan lines, the scan lines and the signal lines both being arranged on the substrate 30. A pixel is arranged near an intersection between the scan line and the signal line. Pixels configuring an organic EL device of the same color are arranged in the column direction along the array direction of the signal lines, and pixels configuring an organic EL device with an emission color of R, G, or B are repeatedly arranged in the row direction along the array direction of the scan lines in a predetermined order. Partition walls 36 each defining an area where an organic EL device is formed by the pixels arranged in the column direction are formed on the substrate 30, and the area surrounded by the partition wall 36 is an area where the solution is applied.

The solution tank 903 is for accumulating the solution. One end of the supply pipe 909 is connected to the solution tank 903 and is communicated therewith.

The supply pipe 909 guides the solution to the nozzle 10. The supply pipe 909 comprises a flexible material.

The pressurizing unit 907 slides inside the solution tank 903 (i.e., a so-called piston motion), pushes the solution accumulated in the solution tank 903 to increase pressure inside the solution tank 903, and allows the solution to flow through the supply pipe 909. The pressurizing unit 907 is driven by the first driving unit 905.

The first driving unit 905 comprises, for example, a compressor (not shown) and a valve (not shown). The first driving unit 905 opens the valve in accordance with a control signal output by the controller 66a, and introduces compressed air accumulated by the compressor into the pressuring unit 907, thereby actuating the pressurizing unit 907.

The flow-rate gauge 911 measures a flow rate of the solution flowing through the supply pipe 909, and outputs an electrical signal to the controller 66a. The flow-rate gauge 911 comprises a flow-rate gauge of, for example, a thermocouple or ultrasound scheme. The flow-rate gauge 911 measures the flow rate of the solution through such a scheme, and outputs a digital signal which is an electrical signal corresponding to the measured flow rate to the controller 66a.

The nozzle 10 has a delivery opening for delivering the solution to the substrate 30, and is connected to another end of the supply pipe 909. The configuration of the nozzle 909 will be discussed in detail later.

The delivery-unit supporting member 915 supports the nozzle 10. The configuration of such a member will be discussed in detail later.

Figure 2:
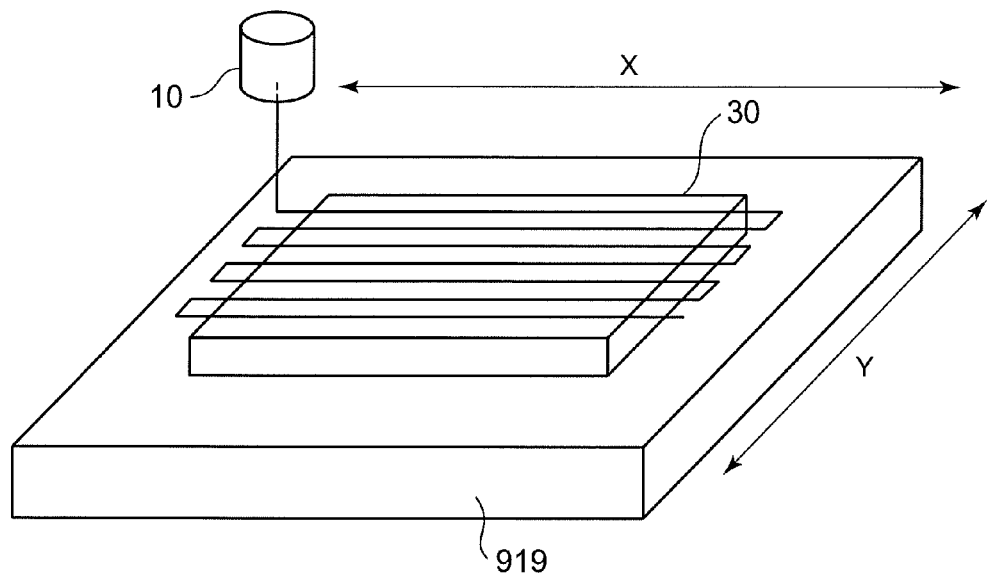
FIG. 2 is an exemplary perspective view showing how a nozzle delivering a solution moves relative to a substrate.

The second driving unit 913 moves the delivery-unit supporting member 915 in a horizontal direction in FIGS. 1 and 2 (the X direction, defined as a main scanning direction) under the control of the controller 66a. That is, the second driving unit 913 moves the delivery-unit supporting member 915 and the nozzle 10 in the horizontal direction relative to the substrate 30. The main scanning direction corresponds to the column direction of the substrate 30.

The stage 919 is for fixing the substrate 30.

The third driving unit 917 is controlled by the controller 66a, and moves the stage 919 in a direction corresponding to the Y direction (which is defined as a sub scanning direction) orthogonal to the X direction in FIG. 2. That is, together with a movement of the stage 919, the substrate 30 moves in the Y direction in FIG. 2. The sub scanning direction corresponds to the row direction of the substrate 30.

The delivery-direction changing unit 40 rotates the nozzle 10 around a vertical axis in order to change the delivery direction of the solution by the nozzle 10. The configuration of such unit will be discussed in detail later.

The controller 66a controls the whole coating apparatus 900 to apply the solution to the substrate 30. More specifically, the controller 66a controls the first driving unit 905 in accordance with an electrical signal output by the flow-rate gauge 911 so that the solution is supplied to the supply pipe 909 at a constant rate by the pressurizing unit 907. Moreover, the controller 66a controls the second driving unit 913 so that the delivery-unit supporting member 915 is moved in the main scanning direction relative to the substrate 30. Furthermore, the controller 66a controls the third driving unit 917 so that the stage 919 is subjected to a step movement in the sub scanning direction after a line of the to-be-coated area of the substrate 30 is coated with the solution. Still further, the controller 66a controls the fourth driving unit 40 so that the delivery direction of the solution is changed in accordance with a travelling direction D of the nozzle 10 relative to the substrate 30. Note that the configuration of the controller 66a will be discussed in detail later. The controller 66a successively performs the foregoing control on all lines where the solution must be applied.

According to the foregoing configuration, as shown in FIG. 2, the nozzle 10 moves relative to the substrate 30 with a zigzag trace, and continuously delivers the solution to the to-be-coated areas of the substrate 30.

Note that the substrate 30 may be directly mounted on the third driving unit 917 and may be moved in the sub scanning direction, instead of employing a configuration that the third driving unit 917 moves the substrate 30 in the sub scanning direction through the stage 919.

In the case of FIG. 2, one nozzle 10 is provided, but the present invention is not limited to this configuration. Equal to two or more nozzles 10 may be provided and plural lines on the substrate 30 may be concurrently coated with the solution by the plural nozzles 10. The difference in this case is that the travel distance of the nozzle 10 in the sub scanning direction by the third driving unit 917 differs from a case in which one nozzle 10 is employed.

Figure 3:
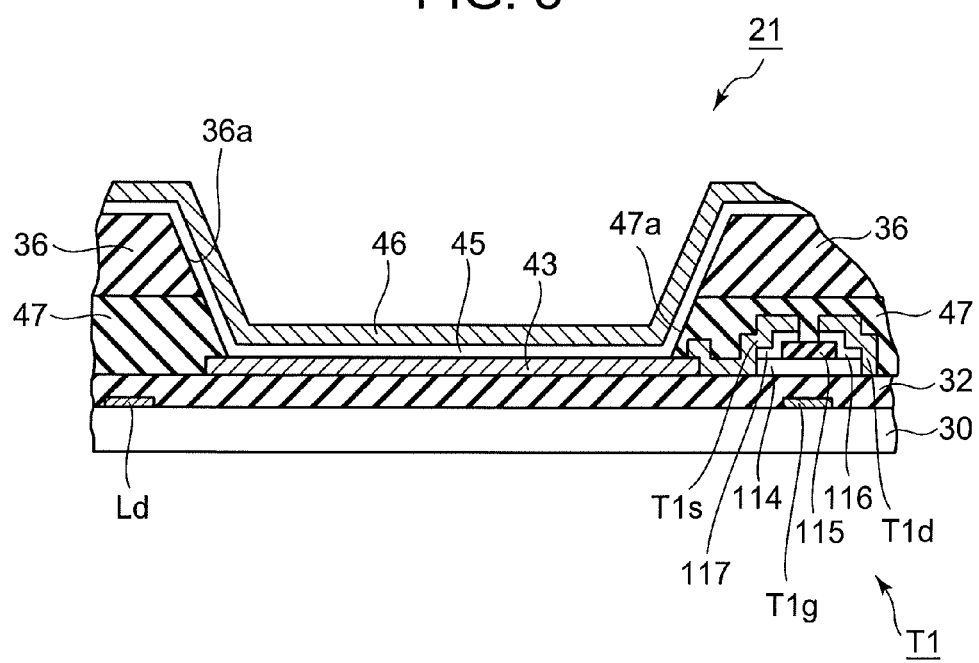
FIG. 3 is a cross-sectional view along a line Y in FIG. 2 which shows a substrate, a partition wall, a pixel electrode, a luminescent layer, and an opposing electrode, all becoming ready to serve as a light emitting device.

Next, with reference to FIG. 3, an explanation will be given of the cross-section structure of the substrate 30, the partition wall 36, a pixel electrode (e.g., an anode electrode) 43, a luminescent layer 45, and an opposing electrode (e.g., a cathode electrode) 46 in the Y direction in FIG. 2 which are ready to serve as a light emitting device 21 as the solution is applied by the nozzle 10 and an organic EL layer is thus formed.

Formed on the substrate 30 are a transistor T1 formed by patterning a gate conductive layer, and a gate electrode T1g for the transistor T1. A data line Ld formed by patterning the gate conductive layer and running in the column direction is also formed on the substrate 30 adjacent to each light emitting pixel.

An insulating film 32 is formed on the gate electrode T1g of the transistor T1 and on the data line Ld by CVD (Chemical Vapor Deposition).

A semiconductor layer 114 formed of, for example, amorphous silicon is formed on the insulating film 32 by CVD or the like. Moreover, an insulating film formed of, for example, SiN is formed on the semiconductor layer 114 by CVD.

Furthermore, a stopper film 115 is formed on the semiconductor layer 114 by patterning the insulating film through photolithography or the like. Still further, ohmic contact layers 116, 117 are each formed on the semiconductor layer 114 and on the stopper film 115 by forming a film of, for example, amorphous silicon containing n-type dopants through CVD or the like and by patterning this film and the semiconductor layer 114 through photolithography or the like.

A drain electrode T1d and a source electrode T1s are provided with a contact hole which is a through hole in the insulating film 32, and are formed by forming a source/drain conductive film like an Mo film, a Cr film, an Al film, a Cr/Al stacked film, AlTi alloy film, AlNdTi alloy film, or MoNb alloy film by sputtering, vapor deposition, etc., and by patterning such a film through photolithography.

The pixel electrode 43 is formed of a conductive material with transparency, such as ITO (Indium Tin Oxide), or ZnO. Each pixel electrode 43 is isolated from adjoining another pixel electrode of another light emitting pixel by an interlayer insulating film 47.

The interlayer insulating film 47 is formed of an insulating material like silicon nitride film, and is formed between adjoining pixel electrodes 43, and insulates and protects each transistor T1, a select line (not shown), and an anode line (not shown). The interlayer insulating film 47 is provided with an opening 47a formed in a substantially-rectangular shape, and the opening 47a defines a light emitting area of the light emitting pixel. Furthermore, an opening 36a formed in a groove shape running in the column direction along the partition wall 36 on the interlayer insulating film 47 is formed across the plural light emitting pixels.

The partition wall 36 is formed of a cured insulating material, e.g., a photosensitive resin like polyimide, and is formed on the interlayer insulating film 47. The partition wall 36 is formed in a striped pattern so as to collectively open respective pixel electrodes 43 of the plural light emitting pixels along the column direction. The planar shape of the partition wall 36 is not limited to the foregoing shape, and may be a lattice pattern having an opening for each pixel electrode 43.

The luminescent layer 45 is formed on the pixel electrode 43. The luminescent layer 45 has a function of emitting light as a voltage is applied between the anode electrode 43 and the opposing electrode 46.

The luminescent layer 45 is formed as the solution is applied by the coating apparatus 900 and a solvent in the solution is caused to volatilize.

The opposing electrode 46 is provided at the luminescent layer 45 side in the case of a bottom-emission type, and employs a stacked structure of an electron-injecting lower layer formed of a conductive material, e.g., a material having a low work function, such as Li, Mg, Ca, or Ba, and an upper layer formed of a light reflective conductive metal like Al.

In the present embodiment, a structure of having only the luminescent layer 45 as an organic EL layer (organic layer)

contributing to light emission is exemplified to facilitate understanding. However, the present invention is not limited to this structure, and the organic EL layer may have a hole-injecting layer and a luminescent layer, or may have a hole-injecting layer, an interlayer, and a luminescent layer.

Figure 4:
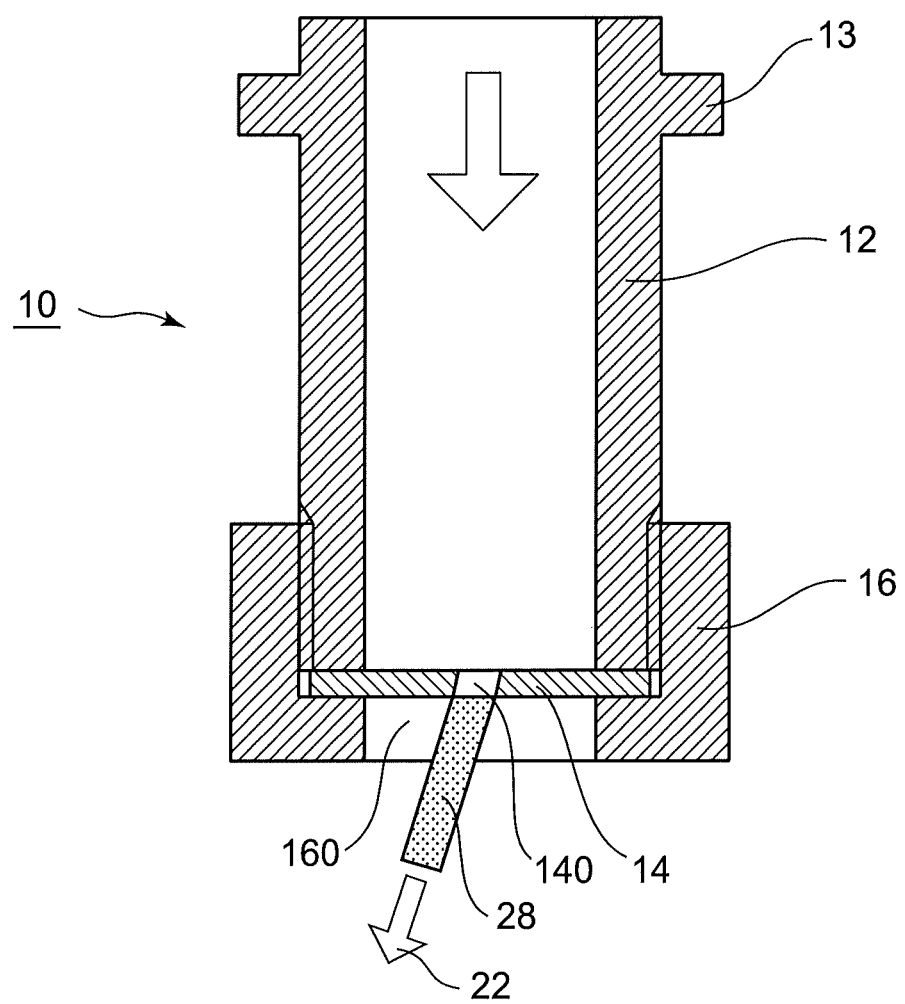
FIG. 4 is a cross-sectional view exemplary showing a nozzle according to an embodiment of the present invention when in a state of delivering a liquid.

Next, an explanation will be given of the nozzle 10 which delivers the solution (organic EL material) with reference to FIG. 4. The nozzle 10 mainly comprises a head cylinder 12, a cylinder flange 13, a nozzle plate 14, and a nozzle cap 16.

The head cylinder 12 is a main body of the nozzle, and is formed in a cylindrical shape. The solution is supplied to the interior of the head cylinder 12 through the supply pipe 909. The cylinder flange 13 in a disc-like shape is protrudingly formed around the outer circumference surface of the upper part of the head cylinder 12. Furthermore, a male screw to be threaded with a female screw of the nozzle cap 16 to be discussed later is formed around the outer circumference surface of the lower part of the head cylinder 12.

Figure 5A:
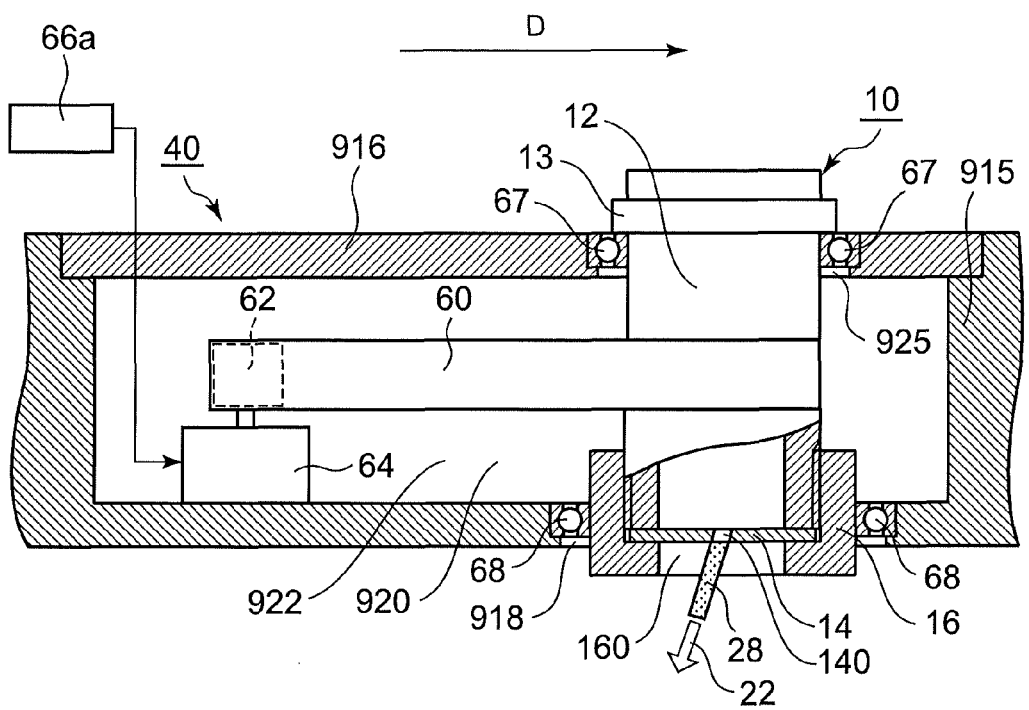
FIG. 5A is a front view (partially including a cross-sectional view) showing a delivery-direction changing unit of the nozzle of a first embodiment.

The cylinder flange 13 has a lower face supported by the inner race of a bearing 67 fitted between the delivery-unit supporting member 915 to be discussed later and the head cylinder 12 as shown in FIG. 5A, and maintains the constant posture of the nozzle 10.

The nozzle plate 14 is formed in a discoid shape, and has a through hole (delivery path for delivering the solution) 140 which is formed at the center and which servers as a delivery opening. The delivery path 140 is so formed as to pass all the way through the nozzle plate 14 and is inclined at a predetermined angle relative to the upper and lower faces of the nozzle plate 14. In other words, the delivery path 140 is inclined at a predetermined angle relative to an axial line of the head cylinder 12.

The nozzle cap 16 is formed in a cap shape, and has a through hole 160 formed at the center thereof. The internal face of the nozzle cap 16 is provided with the female screw to be threaded with the male screw provided around the outer circumference surface of the head cylinder 12. The nozzle cap 16 is screwed in relative to the head cylinder 12 so as to hold the nozzle plate 14 with the lower face of the head cylinder 12. The nozzle plate 14 is embedded in the nozzle 10 thus way.

The nozzle 10 employing the foregoing configuration delivers the solution at a predetermined angle through the delivery path 140 of the nozzle plate 14.

Figure 5B:
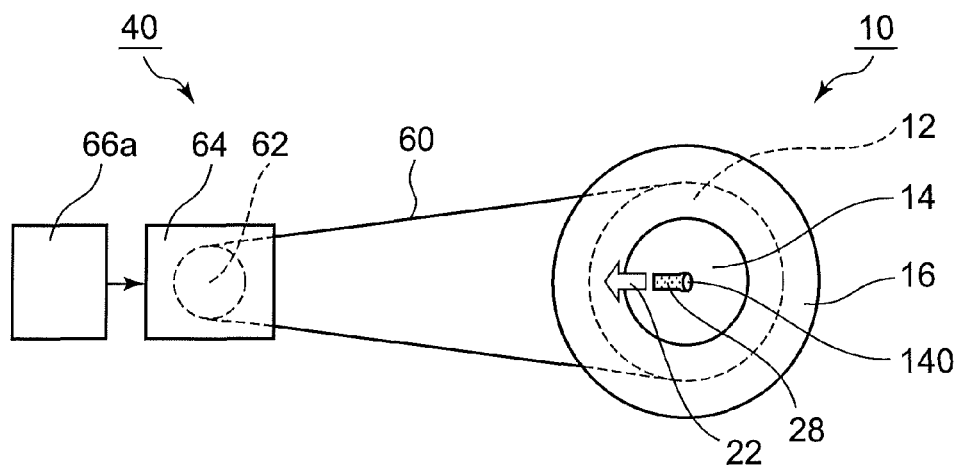
FIG. 5B is a bottom view.

Next, an explanation will be given of the configuration of the delivery-unit supporting member 915 which supports the nozzle 10 with reference to FIGS. 5A and 5B.

The delivery-unit supporting member 915 is formed in a tabular shape, and is partially provided with a concaved recess 920 for retaining the delivery-direction changing unit 40. The delivery-unit supporting member 915 has a through hole 918 formed in a predetermined part of the recess 920. A bearing 68 is fitted in this through hole 918. The nozzle 10 inserted in the through hole 918 is rotatably supported by the bearing 68.

Moreover, a lid member 916 formed in a tabular shape covers the recess 920 so as to be substantially flat with an upper face of the delivery-unit supporting member 915. The lid member 925 has a through hole 925 coaxial with a vertical axis of the through hole 918 of the delivery-unit supporting member 915. The bearing 67 is fitted in this through hole 925. The nozzle 10 inserted in the through hole 925 is rotatably supported by the bearing 67. A retaining space 922 for retaining the delivery-direction changing unit 40 is defined by the lid member 916 and the delivery-unit supporting member 915.

Next, an explanation will be given of the delivery-direction changing unit 40 which changes the delivery direction of the nozzle 10 with reference to FIGS. 5A, 5B, 6A, and 6B. The delivery-direction changing unit 40 is provided inside the delivery-unit supporting member 915, and mainly comprises a belt 60, a pulley 62, a motor 64, and the controller 66a.

The belt 60 is an endless belt hung between the head cylinder 12 and the pulley 62.

The motor 64 is a stepping motor which rotates and drives the pulley 62 at a predetermined angle, and such a rotation angle is controlled by the controller 66a. The motor 64 is fixed in the recess 920 of the delivery-unit supporting member 915.

Figure 6A:
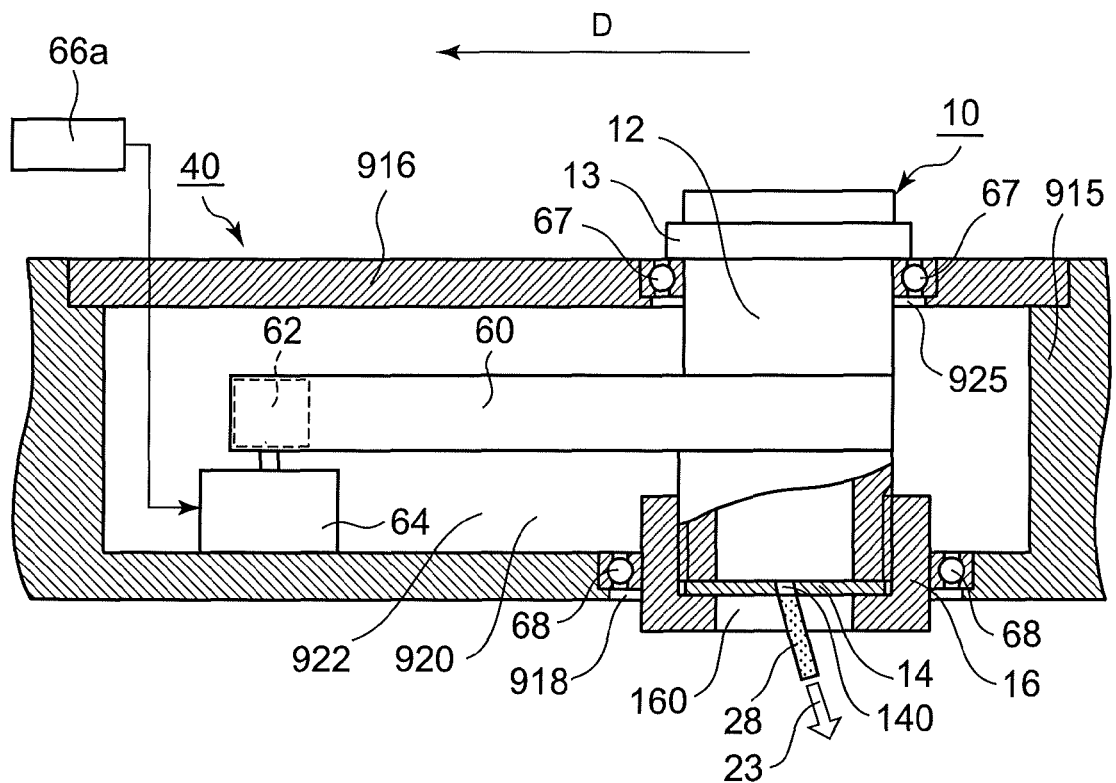
FIG. 6A is a front view (partially including a cross-sectional view) showing the delivery-direction changing unit of the nozzle rotated 180 degree around an axial line from a state shown in FIG. 5A.
Figure 6B:
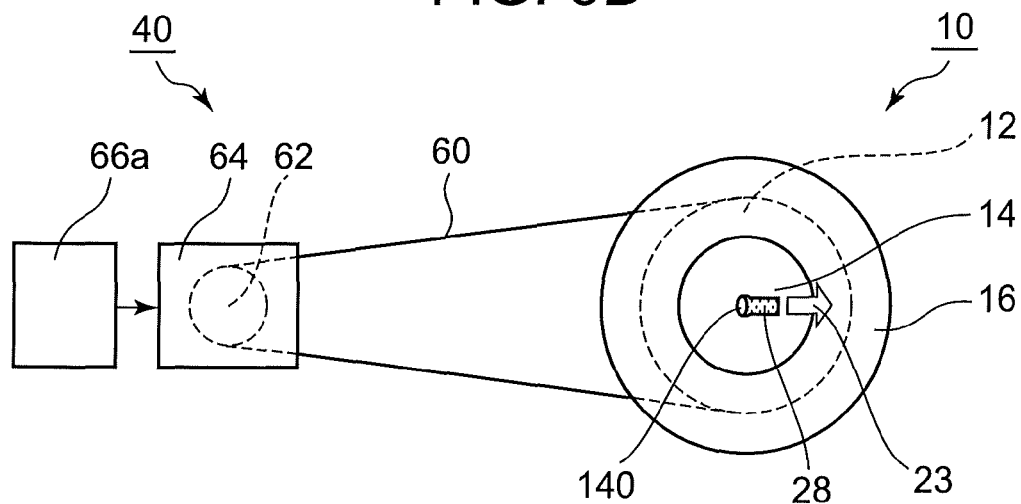
FIG. 6B is a bottom view.

When the travelling direction D of the nozzle 10 relative to the substrate 30 changes from a rightward direction shown in FIG. 5A to a leftward direction shown in FIG. 6A or vice versa, the controller 66a rotates the motor 64 by a predetermined angle. The pulley 62 rotates together with a rotation of the shaft of the motor 64, and the belt 60 also rotates. The head cylinder 12 turns to a position where a delivery direction 23 of the solution delivered from the delivery path 140 becomes opposite to the travelling direction of the nozzle 10 relative to the substrate 30.

The delivery-direction changing unit 40 adjusts the rotation angle of the nozzle 10 in this fashion.

Figure 7A:
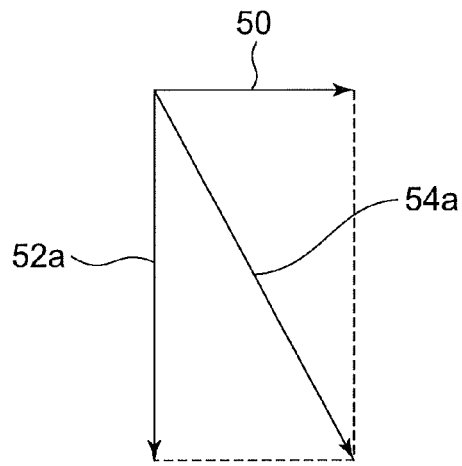
FIG. 7A is a vector diagram showing a delivery speed of a solution by a conventional nozzle relative to a substrate.
Figure 7B:
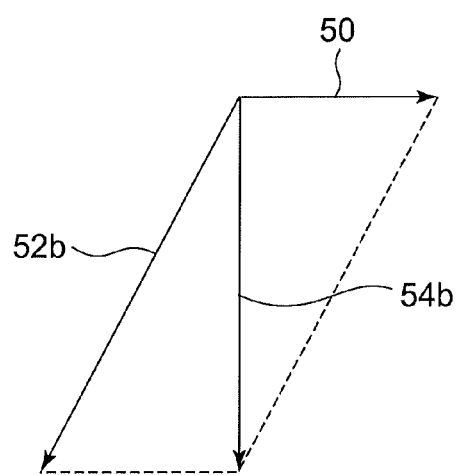
FIG. 7B is a vector diagram showing a delivery speed of a solution by the nozzle of the embodiment of the present invention relative to a substrate.

Next, with reference to FIGS. 7A and 7B, an explanation will be given of a difference in the delivery direction of the solution relative to the substrate 30 between a conventional case in which the solution is delivered vertical to the substrate 30 and a case of the present invention in which the solution is delivered at a predetermined angle.

First, a conventional nozzle delivers the solution vertical to the substrate 30. In this case, as shown in FIG. 7A, a synthesized velocity vector 54a of the solution acquired by synthesizing a nozzle feeding-speed vector 50 with a solution delivery-speed vector 52a is obliquely directed to the feeding direction of the nozzle 10.

In contrast, the nozzle 10 of the present embodiment delivers the solution at a predetermined angle in a delivery direction 22 opposite to the direction of the nozzle feeding-speed vector 50. In this case, as shown in FIG. 7B, a synthesized velocity vector 54b of the solution acquired by synthesizing the nozzle feeding-speed vector 50 with a solution delivery-speed vector 52b has a velocity component in the feeding direction of the nozzle 10 cancelled, and is directed substantially vertical (directed in the substantially vertical direction) to the substrate 30, so that the solution delivered from the nozzle 10 becomes incident to the substrate in the substantially vertical direction. The direction of the delivery direction 22 is set to be a direction in which the synthesized velocity vector 54b is directed substantially vertical to the substrate 30.

With reference to FIGS. 8A to 10B, an explanation will be given of a difference in an apply condition of the solution to the substrate 30 between the nozzle 10 of the present embodiment and a conventional nozzle.

First, provided on the substrate 30 where the solution is applied are circuit structural objects 34, such as a circuit device like a transistor and wiring members, and the partition walls 36 dividing the substrate 30 into individual image display areas.

Figure 8A:
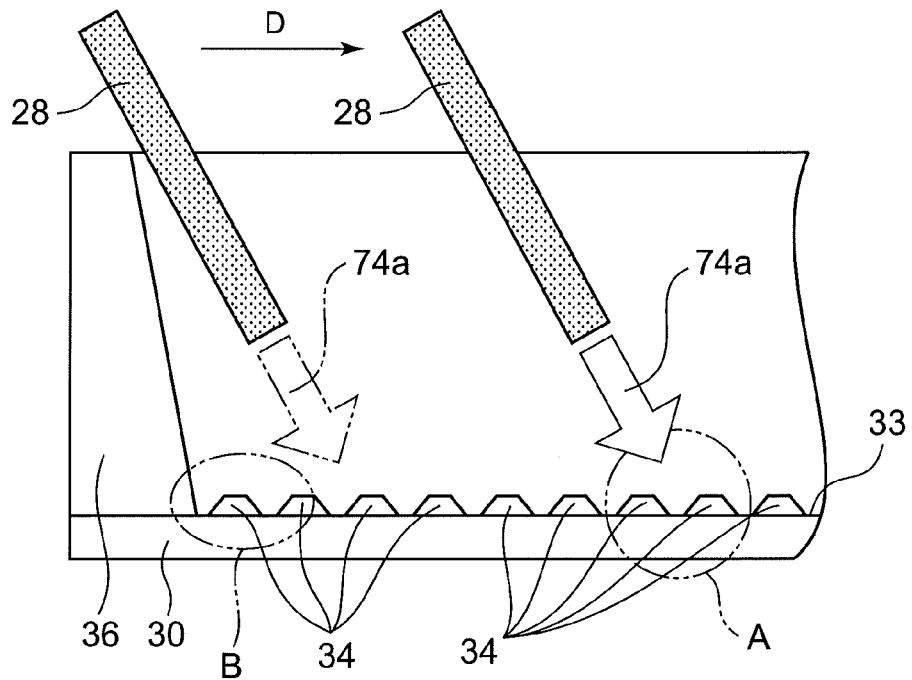
FIG. 8A is a diagram showing two moments when a solution delivered from a conventional nozzle lands on a substrate.

When a conventional nozzle is used, as shown in FIG. 8A, because of a delivered liquid 28 incident in a solution incident direction 74a which corresponds to a directional component of the synthesized velocity vector 54a, the solution is applied on the circuit structural objects 34 present on an apply area 33. As the solution incident direction 74a is inclined relative to the substrate 30, at an area B located behind the delivered liquid 28 delivered along the travelling direction D of the nozzle relative to the substrate 30, the partition wall 36 becomes an obstacle which disturbs the delivered liquid 28 in landing thereon, so that the solution is not sufficiently applied on the circuit structural objects 34 arranged at the area B in the vicinity of the partition wall 36.

Figure 8B:
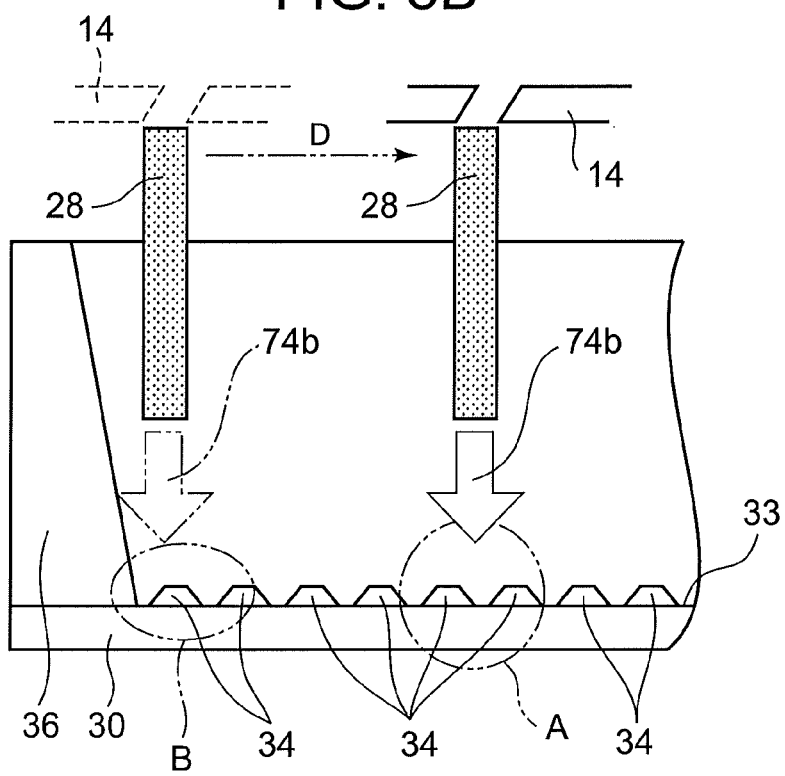
FIG. 8B is a diagram showing two moments when a solution delivered from the nozzle of the embodiment of the present invention lands on a substrate.

In contrast, according to the nozzle 10 of the present embodiment, the direction in which the solution is derived in the delivery path 140 of the nozzle plate 14 is set to be an inclined direction at a predetermined angle relative to the axial line of the head cylinder 12 so as to be opposite to the travelling direction D of the nozzle 10 relative to the substrate 30. Accordingly, as shown in FIG. 8B, the delivered liquid 28 delivered from the delivery path 140 is delivered in a solution incident direction 74b which is a directional component of the synthesized velocity vector 54b. The solution incident direction 74b is substantially vertical to the substrate 30, so that the circuit structural objects 34 on the to-be-coated area 33 are coated with the solution by the delivery liquid 28 incident from the substantially vertical direction. Therefore, it is possible to apply the solution on the circuit structural objects 34 arranged at the area B in the vicinity of the partition wall 36 behind the delivery liquid 28 delivered along the travelling direction D of the nozzle 10 relative to the substrate 30.

Note that a dummy circuit structural object which is formed through the same production process as that of the circuit structural object 34, has the same structure as that of the circuit structural object 34, but has no function as the circuit configured by the circuit structural object 34 may be provided at the area B in the vicinity of the partition wall 36 instead of the circuit structural object 34. According to the technique shown in FIG. 8A, the solution applied on the area B where the dummy circuit structural object is present becomes thinner than the solution applied on a center area A surrounded by the partition wall 36 as explained above. It is fine if the applied solution becomes thin because the dummy structural object has no function as a pixel, but the faster the traveling speed of the nozzle is relative to the substrate 30, the higher the area ratio of the area B in the whole pixels becomes, which brings about a problem that the arrangement area of the dummy circuit structural objects must be increased.

In contrast, according to the technique shown in FIG. 8B, the amount of solution applied on the area B where the dummy circuit structural object is present can be substantially equal to the amount of solution applied on the center area A surrounded by the partition wall 36. Accordingly, the arrangement area of the dummy circuit structural object can be reduced, or it becomes unnecessary to provide any dummy circuit structural object.

Figure 9A:
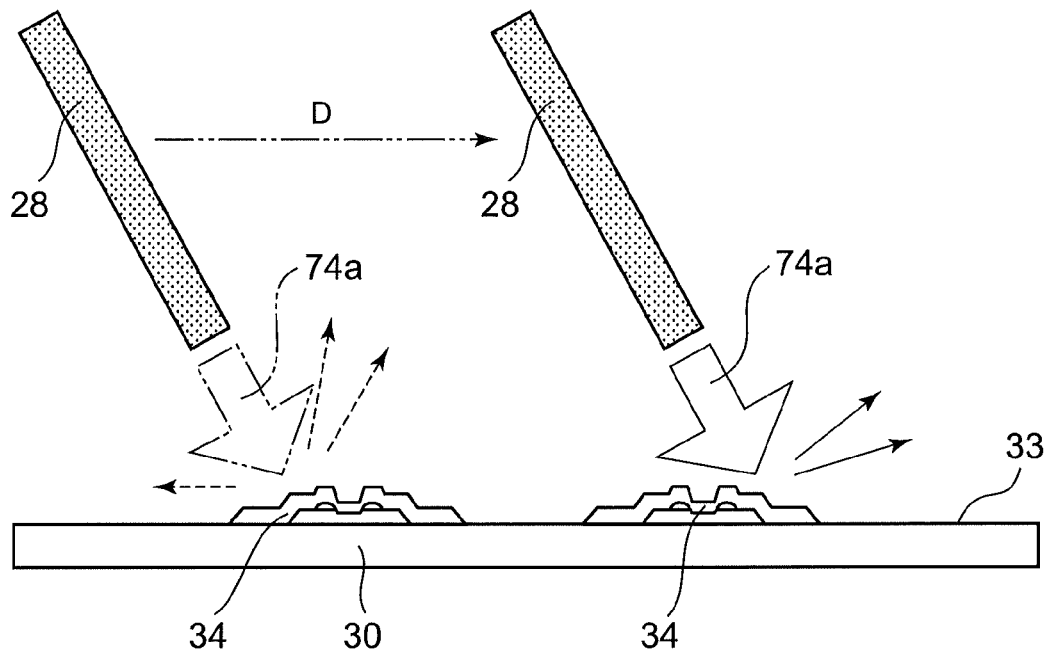
FIG. 9A is a diagram showing an area A shown in FIG. 8A.
Figure 9B:
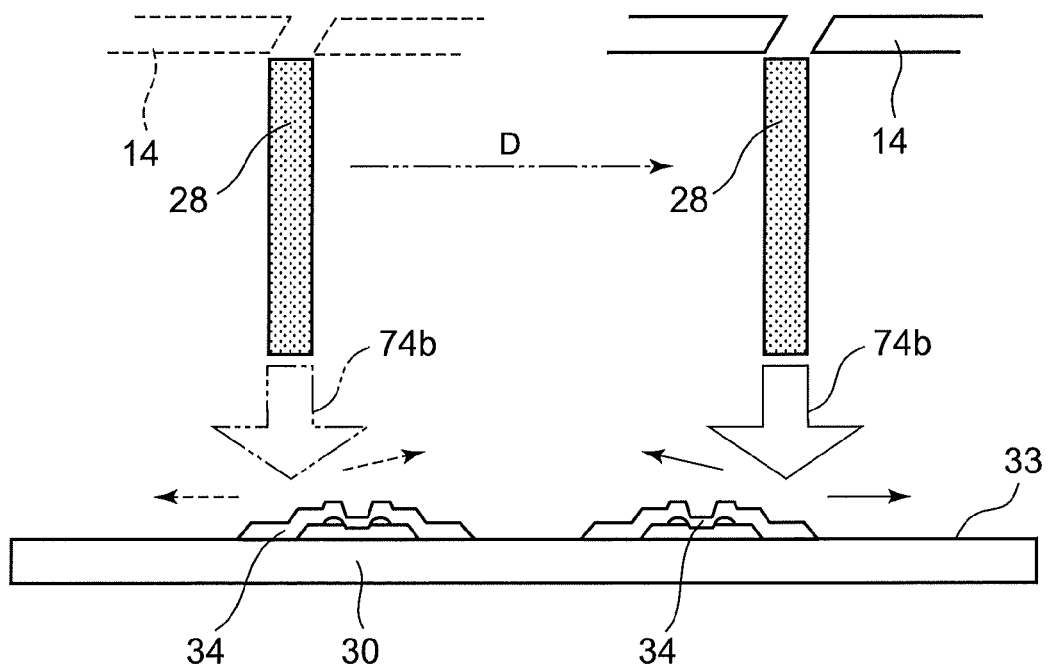
FIG. 9B is a diagram showing an area A shown in FIG. 8B.

FIGS. 9A and 9B show the proximity part of the circuit structural object 34 (e.g., a transistor) shown in FIGS. 8A and 8B in an enlarged manner. When a conventional nozzle is used, as shown in FIG. 9A, the substrate 30 is coated with the solution by the delivered liquid 28 incident in the solution incident direction 74a corresponding to the directional component of the synthesized velocity vector 54a. At this time, the delivered liquid 28 is inclined in the solution incident direction 74a. Accordingly, when delivered from the nozzle and landing on the substrate 30, the solution is urged along the travelling direction D of the nozzle relative to the substrate 30 at the landing point, so that the landing solution rather moves toward the travelling direction D side than moves to the opposite direction to the travelling direction D. As a result, the amount of applied solution varies depending on a location in an area inwardly of the partition wall 36. Moreover, it is necessary to increase the planar dimension of the area B in a case in which the dummy circuit structural object is provide at the area B.

Conversely, according to the nozzle 10 of the present embodiment, the direction of the delivery path 140 is set to be an inclined direction at a predetermined angle relative to the axial line of the head cylinder 12 so as to be opposite to the travelling direction D of the nozzle 10 relative to the substrate 30. Therefore, as shown in FIG. 9B, the substrate 30 is coated with the solution by the delivered liquid 28 delivered from the delivery path 140 and incident in the solution incident direction 74b which is a directional component of the synthesized velocity vector 54b. At this time, as the solution incident direction 74b is substantially vertical to the substrate 30, the delivered liquid 28 becomes incident from the substantially vertical direction, and becomes widespread uniformly and radially from a landing point. Accordingly, it becomes possible for the substrate 30 to acquire a coating surface having a substantially uniform thickness. Moreover, as the delivered liquid 28 is incident to the substrate 30 substantially vertically, the tendency that the landed solution moves toward the opposite direction to the travelling direction D and the tendency that the landed solution moves to the travelling direction D side becomes substantially equal level, so that the solution can be applied at a uniform thickness inwardly of the partition wall 36.

Figure 10A:
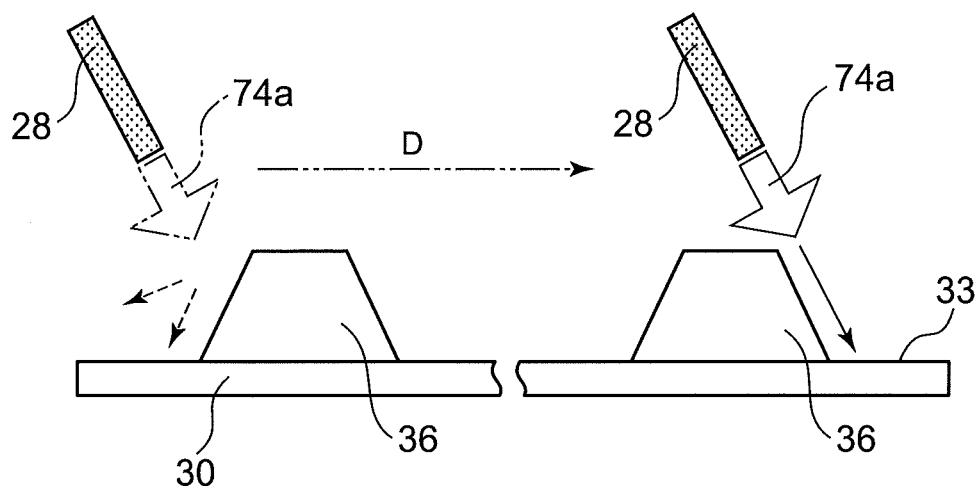
FIG. 10A is a diagram showing two moments when a conventional nozzle goes over a partition wall while delivering a solution.
Figure 10B:
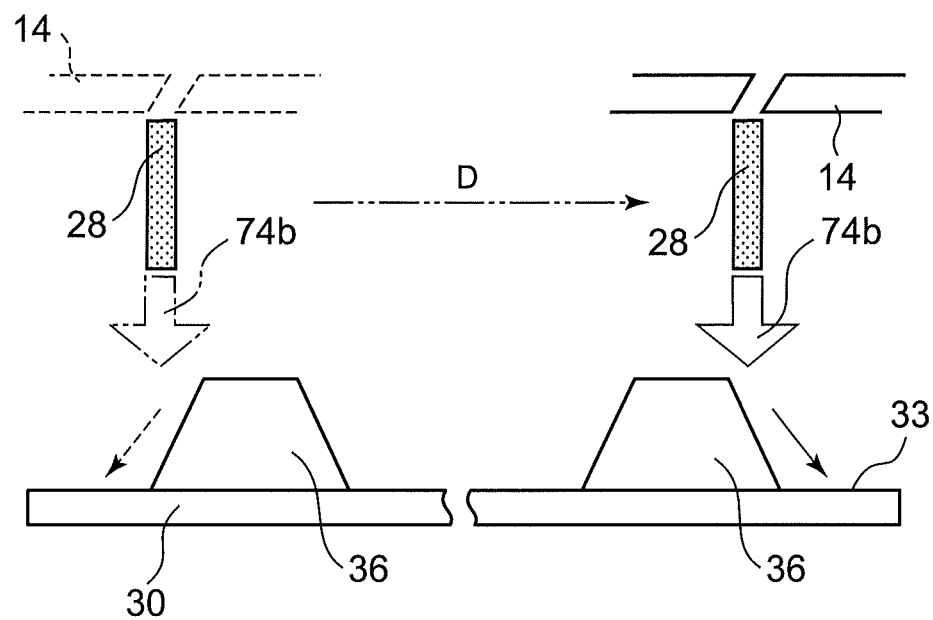
FIG. 10B is a diagram showing two moments when the nozzle of the embodiment of the present invention goes over a partition wall while delivering a solution.

Moreover, in a case in which the substrate 30 moves relative to the nozzle 10 in the sub scanning direction, the application characteristic of the solution becomes fine. FIGS. 10A and 10B show how the nozzle 10 applies the solution before and after going over the partition wall 36.

When a conventional nozzle is used, as shown in FIG. 10A, the incident angle of the solution to the partition wall 36 becomes unsymmetrical before and after the nozzle goes over the partition wall 36. That is, the solution becomes nonuniform in successive movement of the nozzle in the sub scanning direction.

Conversely, when the nozzle 10 of the present embodiment is used, as shown in FIG. 10B, the incident angle of the solution becomes substantially symmetrical before and after the nozzle goes over the partition wall 36. That is, nonuniformity of the solution is not caused in successive movement of the nozzle 10 in the sub scanning direction.

Next, an explanation will be given of an operation of the coating apparatus 900. The controller 66a actuates the second driving unit 913 shown in FIG. 1. The second driving unit 913 moves the delivery-unit supporting member 915 in the main scanning direction at a predetermined speed. The controller 66a outputs an electrical signal to the motor 64 so that the nozzle 10 is directed in an opposite direction to the feeding direction of the delivery-unit supporting member 915 in accordance with an electrical signal generated in order to drive the second driving unit 913. The motor 64 rotates by a predetermined angle in accordance with the electrical signal output by the controller 66a. As the motor 64 rotates, the pulley 62 starts rotating, and the head cylinder 12 is rotated through the belt 60, thereby rotating the nozzle 10 by a predetermined angle.

According to the foregoing operation, the delivery direction of the solution by the nozzle 10 is controlled so as to be always opposite to the travelling direction D of the nozzle 10 (e.g., the moving direction of the delivery-unit supporting member 915). Therefore, the incident direction of the solution relative to the substrate 30 is so maintained as to be substantially vertical to the substrate 30, and as a result, nonuniformity of the application of the solution to the substrate 30 can be prevented.

First Modified Example

Figure 11:
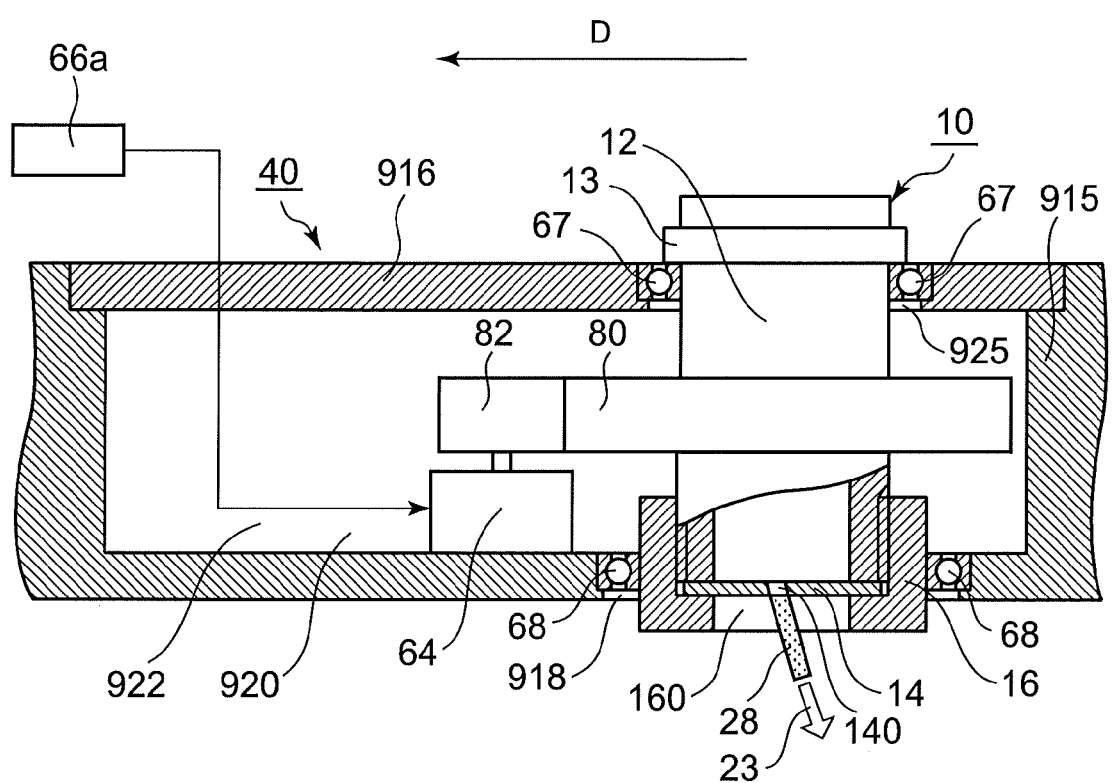
FIG. 11 is a front view (partially including a cross-sectional view) showing a delivery-direction changing unit according to a first modified example.

In the foregoing embodiment, the delivery-direction changing unit 40 which changes the delivery direction comprises the pulley 62 and the belt 60. The present invention is, however, not limited to this configuration. For example, as shown in FIG. 11, as a gear 80 and a pinion 82 are meshed with each other, rotational torque can be transmitted to thereby change the delivery direction of the solution.

An explanation will now be given of this configuration. The gear 80 is fixed around the outer circumference surface of the head cylinder 12. The pinion 82 has an arrangement and a shape so as to be meshed with the gear 80, and is rotated and driven by the motor 64. Such a configuration can function as the delivery-direction changing unit 40 like the configuration comprising the pulley 62 and the belt 60.

Second Modified Example

Next, an explanation will be given of a second modified example related to the shape of the delivery path 140 formed at the center of the nozzle plate 14 with reference to FIGS. 12A and 12B.

Figure 12A:
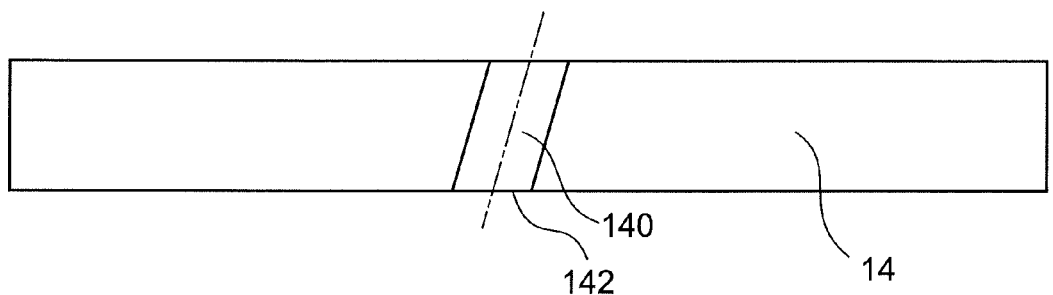
FIG. 12A is a diagram showing a delivery path and a delivery surface formed at a nozzle plate.

A delivery path 140 shown in FIG. 12A is a through hole opened in a delivery surface 142 in an inclined direction by means of laser or the like. The solution flows in an axisymmetrical manner while flowing through the delivery path 140. However, because the delivery surface 142 is not vertical to the axial line of the delivery path 140, the solution is not delivered axisymmetrical from the delivery surface 142, which may cause nonuniformity of application of the solution.

Figure 12B:
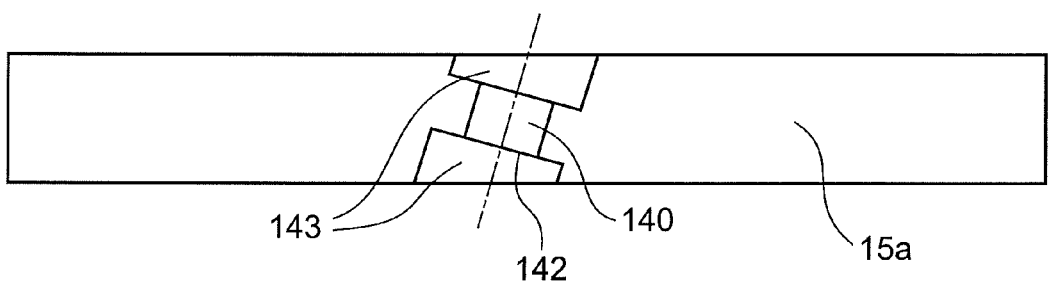
FIG. 12B is a diagram showing a delivery path and a delivery surface formed at a nozzle plate according to a second modified example.

As a configuration in order to suppress any nonuniformity of application of the solution, as shown in FIG. 12B, a nozzle plate 15a has cylindrical grooves 143 formed coaxially with the delivery path 140. The grooves 143 are formed at two locations; an upper part of the delivery path 140 and a lower part thereof.

Third Modified Example

Figure 12C:
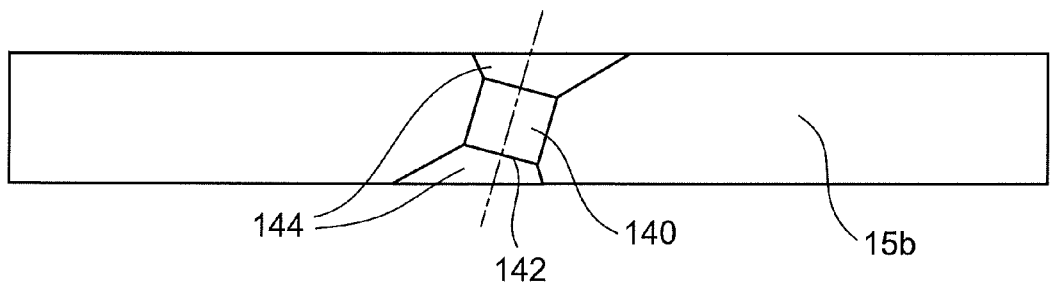
FIG. 12C is a diagram showing a delivery path and a delivery surface formed at a nozzle according to a third modified example.

Furthermore, as shown in FIG. 12C, a nozzle plate 15c has tapered grooves 144 each having a larger diameter part located at the surface side, and formed coaxially with the delivery path 140. The grooves 144 are formed at two locations; an upper part of the delivery path 140 and a lower part thereof.

Like the second and third modified examples, as the cylindrical grooves 143 or the tapered grooves 144 are formed at the upper part of the delivery path 140 and at the lower part thereof in a coaxial manner, an entry surface of the delivery path 140 for the solution and an exit surface (delivery surface 142) thereof become vertical to the delivery path 140. Accordingly, the solution can be delivered from the delivery surface 142 in an axisymmetrical manner, thereby suppressing any nonuniformity of application of the solution.

Second Embodiment

A nozzle 11a according to a second embodiment of the present invention has, unlike the nozzle 10 of the first embodiment, a nozzle plate 15c having a delivery path 141 formed in parallel with the axial line of the head cylinder 12 as shown in FIGS. 13A and 13B. A configuration having such nozzle plate 15c can have a function of changing the delivery direction of the solution opposite to the travelling direction D of the nozzle 11a. Such configuration will be explained in more detail below. In the following explanation, the same structural element as that of the first embodiment will be denoted by the same reference numeral, and the duplicated explanation thereof will be skipped in order to facilitate understanding and explanation.

A delivery-direction changing unit 41 (a second delivery-direction changing unit) which has a function of changing the delivery direction of the solution opposite to the travelling direction D of the nozzle 11a is employed. The delivery-direction changing unit 41 comprises supports 70, 71, two bearings 69, a motor (a second motor) 464, and a controller 66b.

As shown in FIG. 13A, the two supports (supporting shafts) 70, 71 are arranged on an extended line orthogonal to the axial line of the head cylinder 12, protrude from the outer circumference surface of the head cylinder 12, and each formed in a rounded bar shape.

The two bearings 69 are fitted into the through hole 924 of the delivery-unit supporting member 915, and rotatably support the supports 70, 71.

The nozzle 11a is rotatably supported on the delivery-unit supporting member 915 by the supports 70, 71 and the two bearings 69.

The motor 464 is a stepping motor which is fixed on the outer surface of the delivery-unit supporting member 915, and which is coupled to an end of the support 70.

The controller 66b controls the rotational angle of the motor shaft of the motor 464, thereby controlling the rotational angle of the nozzle 11a through the support 70. That is, the delivery angle of the solution is thus controlled.

Next, an explanation will be given of an operation of a coating apparatus 901 having the nozzle 11a and the delivery-direction changing unit 41. The controller 66b actuates the second driving unit 913 shown in FIG. 1. The second driving unit 913 moves the delivery-unit supporting member 915 in the main scanning direction at a predetermined speed. The controller 66b calculates an inclination angle to be set for the nozzle 11a based on the feeding speed of the delivery-unit supporting member 915 and the delivery speed of the solution in accordance with an electrical signal generated in order to derive the second driving unit 913. The controller 66b outputs an electrical signal corresponding to the calculated inclination to the motor 464. The motor 464 rotates the nozzle 11a at a predetermined angle through the motor shaft and the support 70 in accordance with the electrical signal received from the controller 66b. In this fashion, the inclination of the nozzle 11a is controlled in accordance with the delivery speed of the solution and the feeding speed of the nozzle 11a.

Through the foregoing operation, the delivery angle can be changed in accordance with a change in the feeding speed of the nozzle 11a and in the delivery speed of the solution. Accordingly, the solution can be applied always substantially vertically to the substrate 30, resulting in suppression of any coating nonuniformity.

Moreover, unlike the nozzle 10 of the first embodiment which delivers the solution at a predetermined delivery angle, the nozzle 11a of the present embodiment can finely adjust the delivery angle.

Modified Example

Next, an explanation will be given of a delivery-direction changing unit 42 (42a, 42b) (delivery-direction changing unit) which is a modified example of the delivery-direction changing unit 41 and which has a function of changing the delivery direction with reference to FIGS. 14A and 14B.

The delivery-direction changing unit 42 mainly comprises a fixing unit 422a, a fixed supporting unit 420a, a solenoid 426a, and a movable supporting unit 424a.

The fixing unit 422a is fixed on a lower face of the lid member 916 formed in a tabular shape, and has a side face which faces a nozzle 11b and where the fixed supporting unit 420a to be discussed later is fixed.

Figure 14A:
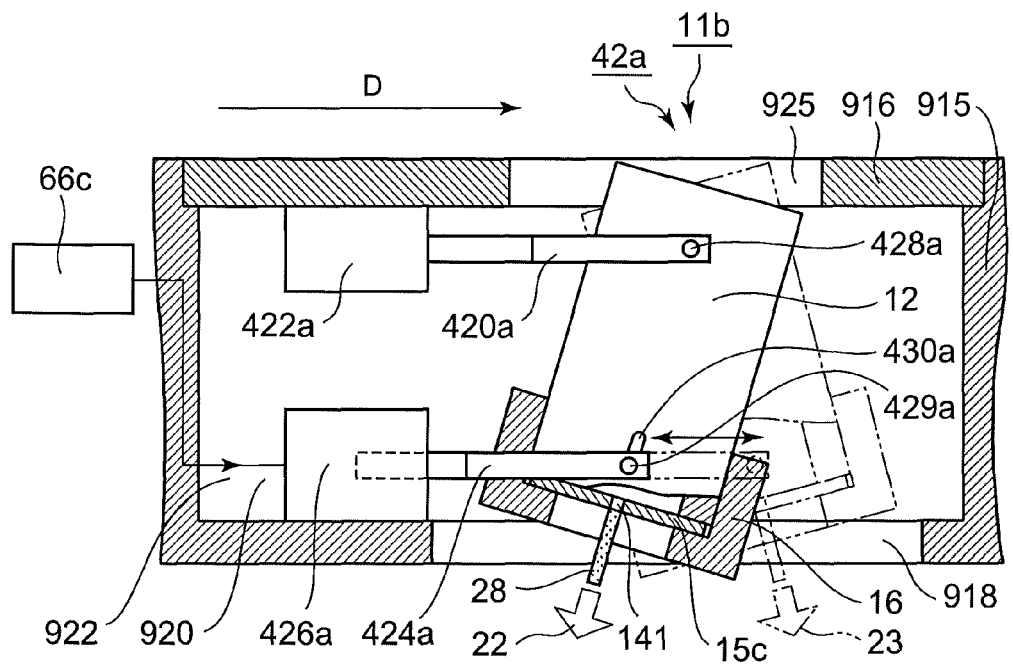
FIG. 14A is a front view showing a delivery-direction changing unit of a nozzle according to a modified example of the second embodiment.
Figure 14B:
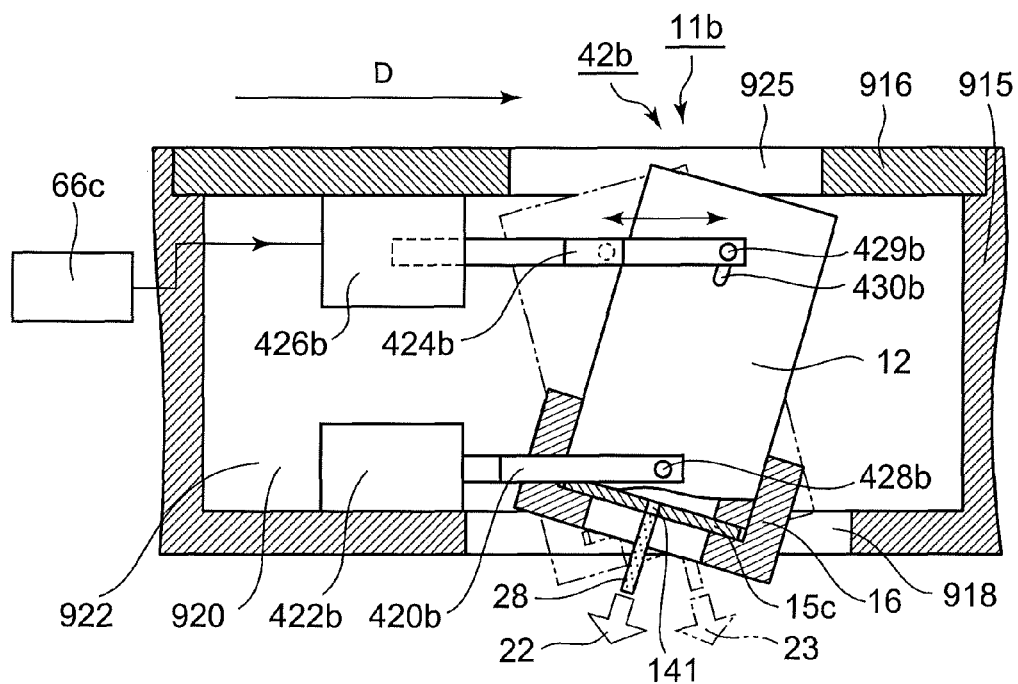
FIG. 14B is a front view showing a delivery-direction changing unit according to another example.

The fixed supporting unit 420a has, as viewed from the above, a right part in FIG. 14A branched in a rectangular shape having one end omitted, and arranged so as to sandwich the upper part of the nozzle 11b in the figure therebetween. The fixed supporting unit 420a rotatably supports the nozzle 11b by means of two opposing pins 428a (only one pin is shown in the figure because of an illustrated angle) at respective positions on a plane passing through the center axis of the nozzle 11b.

The solenoid 426a is fixed on the upper face of the concaved recess 920 formed in the delivery-unit supporting member 915. The solenoid 426a moves the movable supporting unit 424a to be discussed later in the rightward direction or in the leftward direction in the figure in accordance with a current supplied form a controller 66c.

The movable supporting unit 424a has, as viewed from the above, a right part in FIG. 14A branched in a rectangular shape having one end omitted, and arranged so as to sandwich the lower part of the nozzle 11b in the figure therebetween. The movable supporting unit 424 rotatably supports the nozzle 11b by means of two opposing pins 429a (only one pin is shown in the figure because of an illustrated angle) at respective positions on a plane passing through the center axis of the nozzle 11b.

Moreover, at a portion of the nozzle 11b where the pin 429a engages, an ellipse groove 430a having a lengthwise direction parallel to the axial direction of the nozzle 11b is formed. As the groove 430a is formed in the nozzle 11b, when the movable supporting member 424a moves in the horizontal direction, a distance between the pin 428a and the pin 429a changes, so that any application of a load to the fixed supporting unit 420 and to the movable supporting unit 424a from the nozzle 11b through the pins 428a and 429a is suppressed.

Next, an explanation will be given of an operation of a coating apparatus 901 having the nozzle 11b and the delivery-direction changing unit 42a. The controller 66c actuates the second driving unit 913 shown in FIG. 1. The second driving unit 913 moves the delivery-unit supporting member 915 in the main scanning direction at a predetermined speed. The controller 66c calculates an inclination angle set for the nozzle 11b based on the feeding speed of the delivery-unit supporting member 915 and the delivery speed of the solution in accordance with an electrical signal generated in order to drive the second driving unit 913. The controller 66c supplies a current corresponding to the calculated inclination to the solenoid 426a. The solenoid 426a moves the movable supporting unit 424a in accordance with a current supplied from the controller 66c, and turns the nozzle 11b through the pins 429a around the pins 428a at a predetermined angle. In this fashion, the inclination of the nozzle 11b is controlled in accordance with the delivery speed of the solution and the feeding speed of the nozzle 11b.

The explanation was given of a case in which the delivery-direction changing unit 42a of the modified example of the second embodiment fixes the upper part of the nozzle 11b and moves the lower part thereof, thereby turning the nozzle 11b. However, as shown in FIG. 14B, for example, the fixed and movable portions of the nozzle 11b may be inverted, and the nozzle 11b may be turned.

As the delivery-direction changing unit 42b employs such a structure, the lower part of the nozzle 11b in the vicinity of the delivery path 141 is fixed, and the nozzle 11b is turned around the fixed portion (pins 428a) by a solenoid 426b.

Accordingly, when the angle of the nozzle 11b is changed in accordance with a change in the travelling direction D of the nozzle 11b, it is possible to prevent a delivery area of the delivered liquid 28 from the delivery path 141 from becoming widespread, thereby facilitating a control of the nozzle 11b.

The same effect can be accomplished from the delivery-direction changing unit 41 of the second embodiment when the turning center of the nozzle 11b is arranged in the vicinity of the delivery path 41.

The present invention is not limited to the delivery-direction changing unit 42a which fixes the upper portion of the nozzle 11b and moves the lower portion thereof and to the delivery-direction changing unit 42b which fixes the lower portion of the nozzle 11b and moves the upper portion thereof, and for example, can employ a structure of relatively moving both upper and lower portions of the nozzle 11b to make the nozzle 11b inclined.

The nozzle according to the embodiments of the present invention can deliver the solution in an opposite direction to the travelling direction D of the nozzle, so that the solution is applied in a substantially vertical direction to the substrate, thereby acquiring a uniform coating surface.

Moreover, by employing the nozzle of the foregoing embodiments, it becomes possible to form a dummy circuit structural object short.

As cylindrical or tapered grooves are formed in a coaxial manner in the upper part of the delivery path and the lower part thereof, respectively, to make the delivery surface vertical to the delivery path, the solution can be delivered axisymmetrically from the delivery path, thereby suppressing any nonuniformity of application of the solution.

Even if the nozzle has a nozzle plate provided with a delivery path not inclined relative to the axial line of the head cylinder, as the nozzle itself is inclined relative to the coating surface of the substrate, the delivery path can be opposite to the travelling direction D of the nozzle. According to such a structure, in particular, it is possible to finely adjust the angle of the nozzle in accordance with the feeding speed of the nozzle and the delivery speed.

The present invention is not limited to the foregoing embodiments, and can be changed and modified in various forms without departing from the scope and the spirit of the present invention.

For example, in each of the foregoing embodiments, as a technique of moving the nozzle relative to the substrate, the nozzle is moved in the main scanning direction and the stage is fixed when the solution is delivered. The present invention is not limited to this technique, and the nozzle may be fixed but the stage may be moved. In this case, the direction of the stage moving in the main scanning direction may be opposite to the direction of the nozzle moving in the main scanning direction.

Moreover, the nozzle may be moved in one direction in the main scanning direction, while the stage may be moved in another opposite direction in the main scanning direction.

Furthermore, the stage may be always fixed, while the nozzle may be moved in the main scanning direction or in the sub scanning direction, or, the nozzle may be always fixed, while the stage may be moved in the main scanning direction or in the sub scanning direction.

Still further, in each of the foregoing embodiments, it is preferable that the delivered liquid 28 should be a sequence of liquid from the delivery path of the nozzle to a landing point, but the nozzle may be an ink jet type and the delivered liquid 28 may be separate droplets.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A delivery unit which delivers a liquid to a to-be-coated area of an object subject to liquid coating, the delivery unit comprising:
   a main body filled with the liquid; and
   a nozzle plate which is provided at one end side of the main body and which is provided with a delivery path that delivers the liquid,
   wherein:
   an axial line of the delivery path is inclined relative to a rotation axis of the main body toward an opposite side to a traveling direction in which the delivery unit travels relative to the to-be-coated area;
   the main body is supported integrally with the nozzle plate so as to be rotatable about the rotation axis of the main body;
   a rotation angle of the axial line of the delivery path relative to the rotation axis of the main body when the traveling direction of the delivery unit is in a first direction is configured to be controlled by a controller to be different by 180 degrees from the rotation angle when the traveling direction is in a second direction opposite to the first direction, such that the axial line of the delivery path is always inclined toward the opposite side to the traveling direction; and
   an inclination angle of the axial line of the delivery path is set such that a direction in which the liquid delivered from the delivery path is incident on the to-be-coated area coincides with a vertical direction, based on a traveling speed of the delivery unit in the traveling direction and a delivery speed of the liquid from the delivery unit.

2. The delivery unit according to claim 1, wherein a delivery surface of the delivery path for delivering the liquid is perpendicular to the axial line of the delivery path.

3. A coating apparatus which applies a liquid on a to-be-coated area of an object subjected to liquid coating, the coating apparatus comprising:
   a delivery unit including (i) a main body filled with the liquid, and (ii) a nozzle plate which is provided at one end side of the main body and which is provided with a delivery path for delivering the liquid;
   a moving unit which moves at least one of the delivery unit and the object such that the delivery unit travels relative to the to-be-coated area of the object; and
   a delivery-direction changing unit which is configured to make an axial line of the delivery path inclined relative to a mal rotation axis of the main body toward an opposite side to a traveling direction in which the delivery unit travels relative to the to-be-coated area of the object;
   wherein:
   the main body is supported integrally with the nozzle plate so as to be rotatable about the rotation axis of the main body;
   the delivery-direction changing unit is configured to control a rotation angle of the axial line of the delivery path relative to the rotation axis of the main body when the traveling direction of the delivery unit is in a first direction to be different by 180 degrees from the rotation angle when the traveling direction is in a second direction opposite to the first direction, such that the axial line of the delivery path is always inclined toward the opposite side to the traveling direction; and
   an inclination angle of the axial line of the delivery path is set such that a direction in which the liquid delivered from the delivery path is incident on the to-be-coated area coincides with a vertical direction, based on a traveling speed of the delivery unit in the traveling direction and a delivery speed of the liquid from the delivery unit.

* * * * *

UNITED STATES PATENT AND TRADEMARK OFFICE
CERTIFICATE OF CORRECTION

PATENT NO.       : 8,534,222 B2
APPLICATION NO.  : 12/874401
DATED            : September 17, 2013
INVENTOR(S)      : Isao Ebisawa Page 1 of 1

It is certified that error appears in the above-identified patent and that said Letters Patent is hereby corrected as shown below:

In the Claims

Column 16, Line 16; Claim 3, Line 13:

before "rotation" delete "mal".

Signed and Sealed this
Thirty-first Day of December, 2013

Margaret A. Focarino
*Commissioner for Patents of the United States Patent and Trademark Office*